US010901041B2

(12) United States Patent
Nagasue

(10) Patent No.: US 10,901,041 B2
(45) Date of Patent: Jan. 26, 2021

(54) SEMICONDUCTOR DEVICE, BATTERY MONITORING SYSTEM AND SEMICONDUCTOR DEVICE ACTIVATION METHOD

(71) Applicant: LAPIS SEMICONDUCTOR CO., LTD., Kanagawa (JP)

(72) Inventor: Makoto Nagasue, Kanagawa (JP)

(73) Assignee: LAPIS SEMICONDUCTOR CO., LTD., Yokohama (JP)

(*) Notice: Subject to any disclaimer, the term of this patent is extended or adjusted under 35 U.S.C. 154(b) by 394 days.

(21) Appl. No.: 15/959,357

(22) Filed: Apr. 23, 2018

(65) Prior Publication Data

US 2018/0313902 A1 Nov. 1, 2018

(30) Foreign Application Priority Data

May 1, 2017 (JP) .................................. 2017-091292

(51) Int. Cl.
*G01R 31/382* (2019.01)
*H01M 10/48* (2006.01)
*H02J 7/00* (2006.01)
*H02J 13/00* (2006.01)
*G01R 31/396* (2019.01)

(52) U.S. Cl.
CPC ......... *G01R 31/382* (2019.01); *G01R 31/396* (2019.01); *H01M 10/48* (2013.01); *H01M 10/482* (2013.01); *H02J 7/0021* (2013.01); *H02J 13/0003* (2013.01)

(58) Field of Classification Search
CPC . G01R 31/382; G01R 31/396; H01M 10/482; H01M 10/48; H01M 10/425; H02J 13/0003; H02J 7/0021; H02J 7/02; Y02E 60/10
See application file for complete search history.

(56) References Cited

U.S. PATENT DOCUMENTS 7,471,065 B2 * 12/2008 Emori ..................... H02J 3/38
320/116
9,470,761 B2 * 10/2016 Kiuchi ................. G01R 31/382
9,746,525 B2 * 8/2017 Kudo ........................ B60L 3/04
(Continued)

FOREIGN PATENT DOCUMENTS

JP 2014134454 A 7/2014
JP 2015136289 A 7/2015

*Primary Examiner* — Nha T Nguyen
(74) *Attorney, Agent, or Firm* — Volentine, Whitt & Francos, PLLC

(57) ABSTRACT

A semiconductor device includes: a first and a second receiving sections that receive control signals from outside; a control section that controls monitoring of an object based on the control signals; and a power supply section that supplies power to internal circuits of the semiconductor device, wherein, when the power supply section is in a halted state, and when the first receiving section receives an activation, the first receiving section generates an activation trigger that activates the power supply section based on the activation pulse signal extracted from the activation signal, and wherein the second receiving section receives a supply of power from the power supply section after the power supply section has been activated by the activation trigger, and receives the control signals that follows the activation signal, and sends the control signals to the control section.

11 Claims, 5 Drawing Sheets

(56) References Cited

U.S. PATENT DOCUMENTS

| | | | |
|---|---|---|---|
| 9,759,781 B2* | 9/2017 | Ohtake | G01R 31/396 |
| 10,018,680 B2* | 7/2018 | Kikuchi | H03K 19/018528 |
| 10,466,307 B2* | 11/2019 | Jeon | G01R 31/3835 |
| 2003/0044689 A1* | 3/2003 | Miyazaki | H01M 10/425 |
| | | | 429/320 |
| 2007/0182377 A1* | 8/2007 | Vandensande | G01R 31/396 |
| | | | 320/132 |
| 2008/0238432 A1* | 10/2008 | Botker | G01R 31/396 |
| | | | 324/434 |
| 2009/0302802 A1* | 12/2009 | Miyazaki | B60L 58/21 |
| | | | 320/116 |
| 2010/0209748 A1* | 8/2010 | Kudo | H02J 7/0021 |
| | | | 429/91 |
| 2013/0088237 A1* | 4/2013 | Kamata | H04Q 9/00 |
| | | | 324/434 |
| 2014/0191765 A1* | 7/2014 | Takeshita | B60L 58/18 |
| | | | 324/434 |
| 2015/0155722 A1* | 6/2015 | Kudo | H02J 7/0021 |
| | | | 320/116 |
| 2015/0241520 A1* | 8/2015 | Ohtake | G01R 31/396 |
| | | | 324/434 |
| 2016/0061905 A1* | 3/2016 | Kikuchi | H03K 17/687 |
| | | | 324/434 |
| 2016/0261127 A1* | 9/2016 | Worry | H01M 10/4207 |
| 2019/0086475 A1* | 3/2019 | Takeshita | G01R 31/392 |

* cited by examiner

SEMICONDUCTOR DEVICE, BATTERY MONITORING SYSTEM AND SEMICONDUCTOR DEVICE ACTIVATION METHOD

CROSS-REFERENCE TO RELATED APPLICATION

This application claims priority under 35 USC 119 from Japanese Patent Application No. 2017-091292 filed on May 1, 2017, the disclosure of which is incorporated by reference herein.

BACKGROUND

Technical Field

The present disclosure relates to a semiconductor device, a battery monitoring system, and an activation method for a semiconductor device.

Related Art

Recently, in conjunction with the increasingly widespread use of systems that utilize secondary batteries, such as electric motor systems and power storage systems and the like. Further, it has also become critical to monitor various states, such as over-charging, over-discharging, and temperature abnormalities and the like, and to monitor whether or not any abnormalities are present in a charging current or a discharging current or the like, in systems that utilize these secondary batteries. Accordingly, there is a trend towards integrating the functions of monitoring systems that utilize secondary batteries in a battery monitoring IC (Integrated Circuit).

In some cases, battery monitoring IC transmit the results of their monitoring to a control section, for example, a Micro Controller Unit (referred to below as a 'MCU') that includes an operating mode and the like for a system that utilizes a secondary battery, and collectively controls the entire system. The battery monitoring IC may receive commands generated from the results of such transmissions, and control each circuit block of the battery monitoring IC. In conjunction with the increasing number of and increased congestion in subjects being monitored and controlled in systems that utilize secondary batteries, demands are being made for greater efficiency in communication between the battery monitoring IC and the MCU.

As the control signals exchanged between a battery monitoring IC and a MCU there are activation signals for activating the battery monitoring IC. As efforts to increase the efficiency of communication between battery monitoring IC and MCU, studies are underway regarding the communication format of activation signals.

Japanese Patent Application Laid-Open (JP-A) No. 2015-136289 discloses, for example, a transmission of an activation signal in a battery monitoring system. The battery monitoring/control integrated circuit disclosed in JP-A No. 2015-136289 is connected to a cell group configured by connecting plural section battery cells together in series, and monitors and controls each of the section battery cells. This battery monitoring/control integrated circuit is provided with an AC activation signal input terminal that is connected to a DC signal generating circuit. The DC signal generating circuit generates a DC signal based on an AC activation signal input from the outside. An activation detecting section detects the DC signal and activates the battery monitoring/ control integrated circuit. An activation output section, after the battery monitoring/control integrated circuit has been activated, outputs an AC activation signal to the outside.

Moreover, JP-A No. 2014-134454 discloses a battery monitoring system activation method. The battery monitoring system disclosed in JP-A No. 2014-134454 includes activation circuits 40 and 60 that control activation of a regulator 30, and the activation circuit 40 and the activation circuit 60 include an activation circuit 40A that outputs an L-level power-up signal that activates the regulator 30 in accordance with an activation signal INT input from an MCU 16 of a control circuit section 14. Additionally, the activation circuit 40 and the activation circuit 60 are provided with an activation circuit 40B or an activation circuit 40C that, in accordance with a voltage potential VDD generated by the regulator 30 of a lower order or upper order (whichever is activated first) battery monitoring IC 20, output an L-level power-up signal that activates the regulator 30.

In a semiconductor device, as integration has become increasingly advanced, reducing the number of terminals used to connect the semiconductor device to the outside is required. Battery monitoring IC are no exception to this, and reducing the number of terminals that are used for external connections would contribute further miniaturization in a battery monitoring IC, and would also allow terminals for new functions to be assigned. However, generally, it is difficult to reduce the number of terminals without reducing the actual signals.

On the other hand, there are examples of battery monitoring IC groups being configured by connecting in series battery monitoring IC that collectively monitor plural batteries. However, when considering the aforementioned number of terminals, it is necessary to also consider transmission paths of the activation signals. In other words, it is necessary to consider how to transmit activation signals in sequence, if all of the battery monitoring IC are in a halted state, or how to perform the activation in a case in which, some of the battery monitoring ICs are in a halted state, after the battery monitoring IC that are connected together in series have been activated.

Creating activation signals in battery monitoring systems is also the subject in JP-A No. 2015-136289 and JP-A No. 2014-134454, however the technology disclosed in JP-A No. 2015-136289 and JP-A No. 2014-134454 are not in the above standpoint.

SUMMARY

The present disclosure provides a semiconductor device, a battery monitoring system including the semiconductor device, and a semiconductor device activation method that may reliably perform transmission of activation signals with a simple configuration that renders dedicated paths unnecessary, even in a case in which multiple connection stages are present.

A first aspect of the present disclosure is a semiconductor device including: a first receiving section and a second receiving section that receive control signals from outside of the semiconductor device; a control section that controls monitoring of an object based on the control signals; and a power supply section that supplies power to internal circuits of the semiconductor device, wherein, in a case in which the power supply section is in a halted state, and in a case in which the first receiving section receives an activation signal in which an activation pulse signal is superimposed on the control signals, the first receiving section generates an activation trigger that activates the power supply section based on the activation pulse signal extracted from the activation signal, and wherein the second receiving section receives a supply of power from the power supply section after the power supply section has been activated by the activation trigger, and receives the control signals that follows the activation signal, and sends the control signals to the control section.

A second aspect of the present disclosure is a battery monitoring system including: a battery; the semiconductor device according to the first aspect 1 in which the battery is the object to monitor; a monitoring device that transmits the control signals; and a converting device that converts the control signals to activation signals.

A third aspect of the present disclosure is a semiconductor device activation method for a semiconductor device including: a first receiving section and a second receiving section that receive control signals from outside of the semiconductor device, a control section that controls monitoring of an object based on the control signals, and a power supply section that supplies power to internal circuits, the method including: generating, by the first receiving section, in a case in which the power supply section is in a halted state, and in a case in which the first receiving section receives an activation signal in which an activation pulse signal is superimposed on a control signal, an activation trigger that activates the power supply section based on the activation pulse signal extracted from the activation signal; and receiving, by the second receiving section, a supply of power from the power supply section after the power supply section has been activated by the activation trigger, and receiving the control signals that follows the activation signal, and sending the control signals to the control section.

According to the above aspect, the present disclosure may provide a semiconductor device, a battery monitoring system including the semiconductor device, and a semiconductor device activation method that may reliably perform transmission of activation signals with a simple configuration that renders dedicated paths unnecessary, even in a case in which multiple connection stages are present.

BRIEF DESCRIPTION OF THE DRAWINGS

Exemplary embodiment of the present disclosure will be described in detail based on the following figures, wherein.

DETAILED DESCRIPTION

Hereinafter, an embodiment of the present disclosure will be described in detail with reference made to FIG. 1 through FIG. 5.

Figure 1:
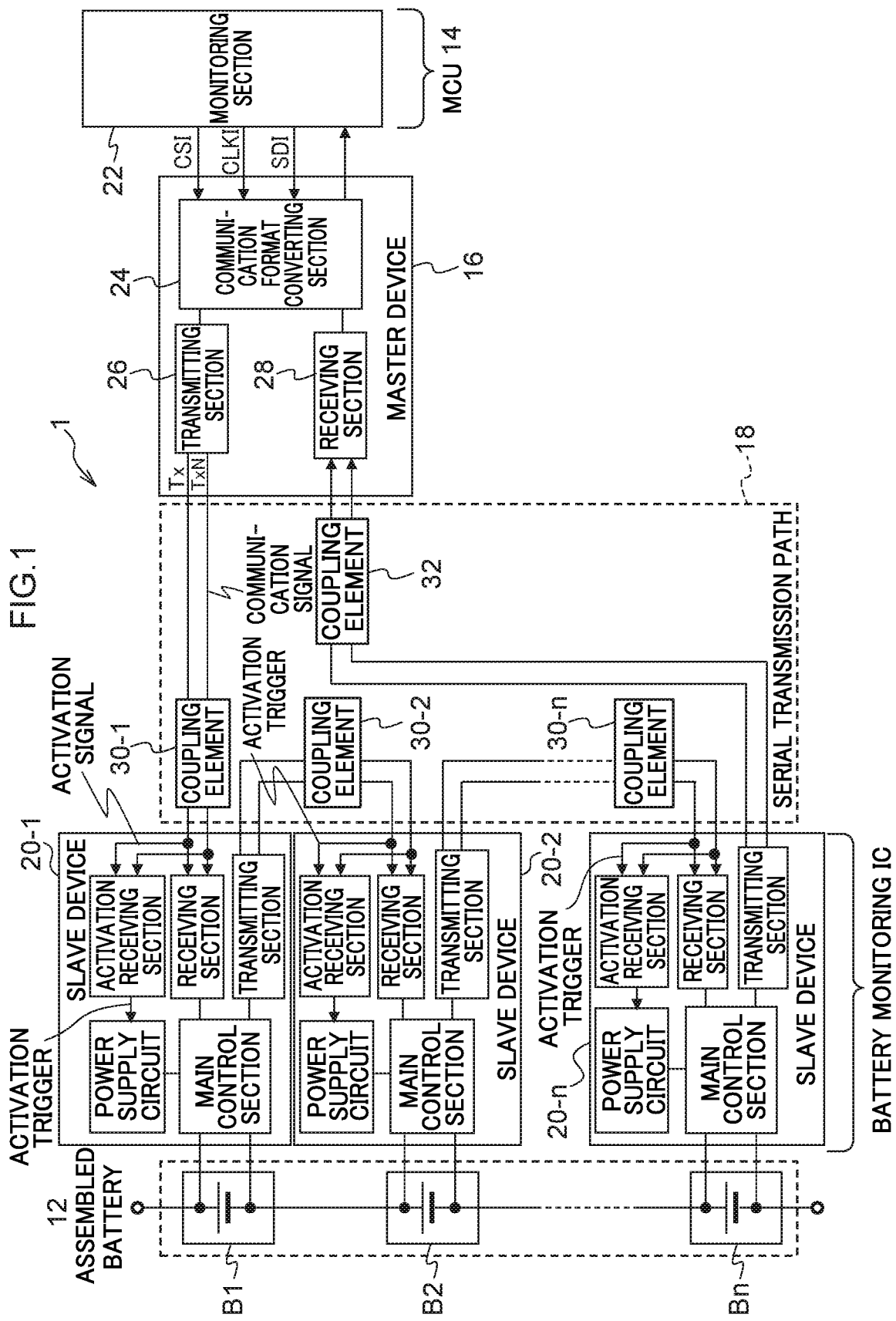
FIG. 1 is a block diagram showing a configuration of a battery monitoring system according to an exemplary embodiment.

As is shown in FIG. 1, a battery monitoring system 1 according to the present exemplary embodiment includes slave devices 20-1, 20-2, . . . , 20-n (hereinafter, when described collectively these will be referred as 'slave devices 20'), an assembled battery 12, a MCU 14, a master device 16, and a serial transmission path 18. The battery monitoring system 1 is a system that monitors the state of the batteries that are connected together in series using a monitoring section of the MCU 14. The slave devices 20 correspond to 'semiconductor devices' according to the present disclosure, the MCU 14 corresponds to 'monitoring device' according to the present disclosure, and the master device 16 corresponds to 'converting device' according to the present disclosure.

The assembled battery 12 is configured by connecting plural (in FIG. 1, an example is shown of n number of battery cells) battery cells B1, B2, . . . , Bn (hereinafter, when described collectively these will be referred as 'battery cells B') together in series, which serve as the objects being monitored.

Plural (in FIG. 1, an example of n number of slave devices is shown) slave devices 20-1, 20-2, . . . , 20-n are provided so as to correspond to the battery cells B, and respectively monitor their corresponding battery cell B. Each of the slave devices 20 corresponds to a battery monitoring IC according to the present exemplary embodiment. As is shown in FIG. 1, the slave devices 20-1, 20-2, . . . , 20-n are connected together in series. In other words, the slave devices 20-1, 20-2, . . . , 20-n are connected together from the upstream side towards the downstream side such that a transmission section output on the upstream side is connected via a coupling element to a reception section input on the downstream side. Moreover, the most downstream transmission section output is connected to a reception section input of the master device 16. By employing this looping daisy-chain connection configuration, looping high-speed communication from a monitoring section 22 is enabled. This high-speed communication loop corresponds to the 'looping communication path' according to the present disclosure.

The MCU 14 collectively controls the entire battery monitoring system 1, and is provided with the monitoring section 22. The monitoring section 22 has a communication interface function, and accesses the slave devices 20 (i.e., the battery monitoring IC), which are slaves in the communication from the relevant communication interface via the master device 16.

The master device 16 converts the communication format between the MCU 14 and the slave devices 20, and is provided with a communication format converting section 24, a transmitting section 26, and a receiving section 28. In the present exemplary embodiment, since the interface on the MCU 14 side is a four-line serial interface, and the interface on the slave device 20 side has a two-line differential format, the master device 16 converts the communication formats between these interfaces. The master device 16 according to the present exemplary embodiment is implemented by a dedicated semiconductor device, however, the present disclosure is not limited to this. The master device 16 may be implemented, for example, as an internal circuit within the MCU 14.

The serial transmission path 18 includes plural coupling elements 30-1, 30-2, . . . , 30-n (hereinafter, when described collectively, will be referred as 'coupling elements 30') that are provided to correspond to the slave devices 20-1, 20-2, . . . , 20-n. The serial transmission path 18 further includes a coupling element 32 provided on a return path of the looping communication path. As an example, the serial transmission path 18 may be configured by a printed circuit board on which the coupling elements 30 and 32 are mounted. The coupling elements 30 and 32 are elements that principally cut out DC components from transmitted signals, and are configured by transistors in the present exemplary embodiment. In other words, coupling elements, such as transistors or the like, that are used to isolate DC voltage are inserted between the master device 16 and the slave devices 20. However, the present disclosure is not limited to this. The coupling elements 30 and 32 to be configured, for example, by photo couplers or capacitors. The coupling elements 30 and 32 correspond to the 'DC cut-out elements' of the present disclosure.

As is shown in FIG. 1, signals output from the transmitting section 26 of the master device 16 are input to a receiving section 42 (see FIG. 2) of the slave device 20-1 via the coupling element 30-1. In the present exemplary embodiment, the slave devices 20-1, 20-2, . . . , 20-*n* are connected together in series (forming a 'daisy-chain'). In other words, a transmitting section 44 (see FIG. 2) of the slave device 20-1 is connected via the coupling element 30-2 to the receiving section 42 (see FIG. 2) of the slave device 20-2, and the transmitting section 44 of the slave device 20-2 is connected via a coupling element 30-3 (not shown in the drawings) to the receiving section 42 of a slave device 20-3 (not shown in the drawings). Thereafter, in the same way, the transmitting section 44 of a slave device 20-(*n*–1) (not shown in the drawings) is connected via the coupling element 30-*n* to the receiving section 42 of the slave device 20-*n*.

Figure 2:
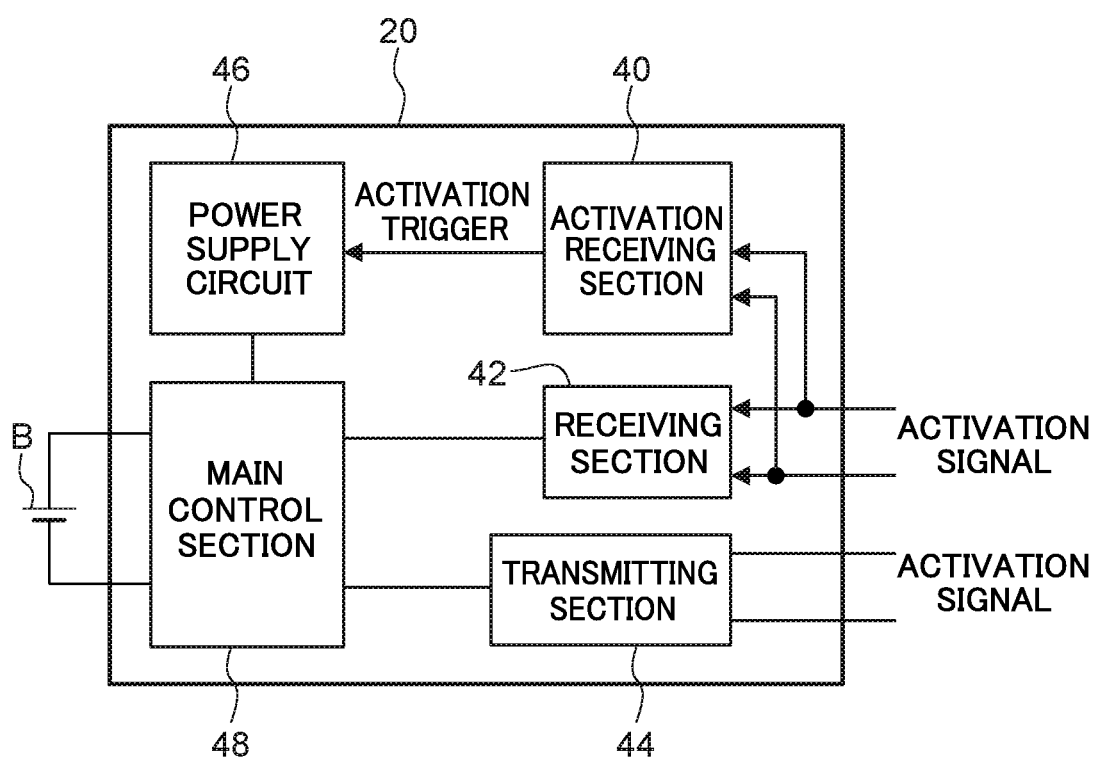
FIG. 2 is a block diagram showing a configuration of a slave device according to an exemplary embodiment.

As is shown in FIG. 2, the slave devices 20 according to the present exemplary embodiment includes an activation receiving section 40, the receiving section 42, the transmitting section 44, a power supply circuit 46, and a main control section 48. A detailed description of the slave devices 20 is given below.

Figure 5:
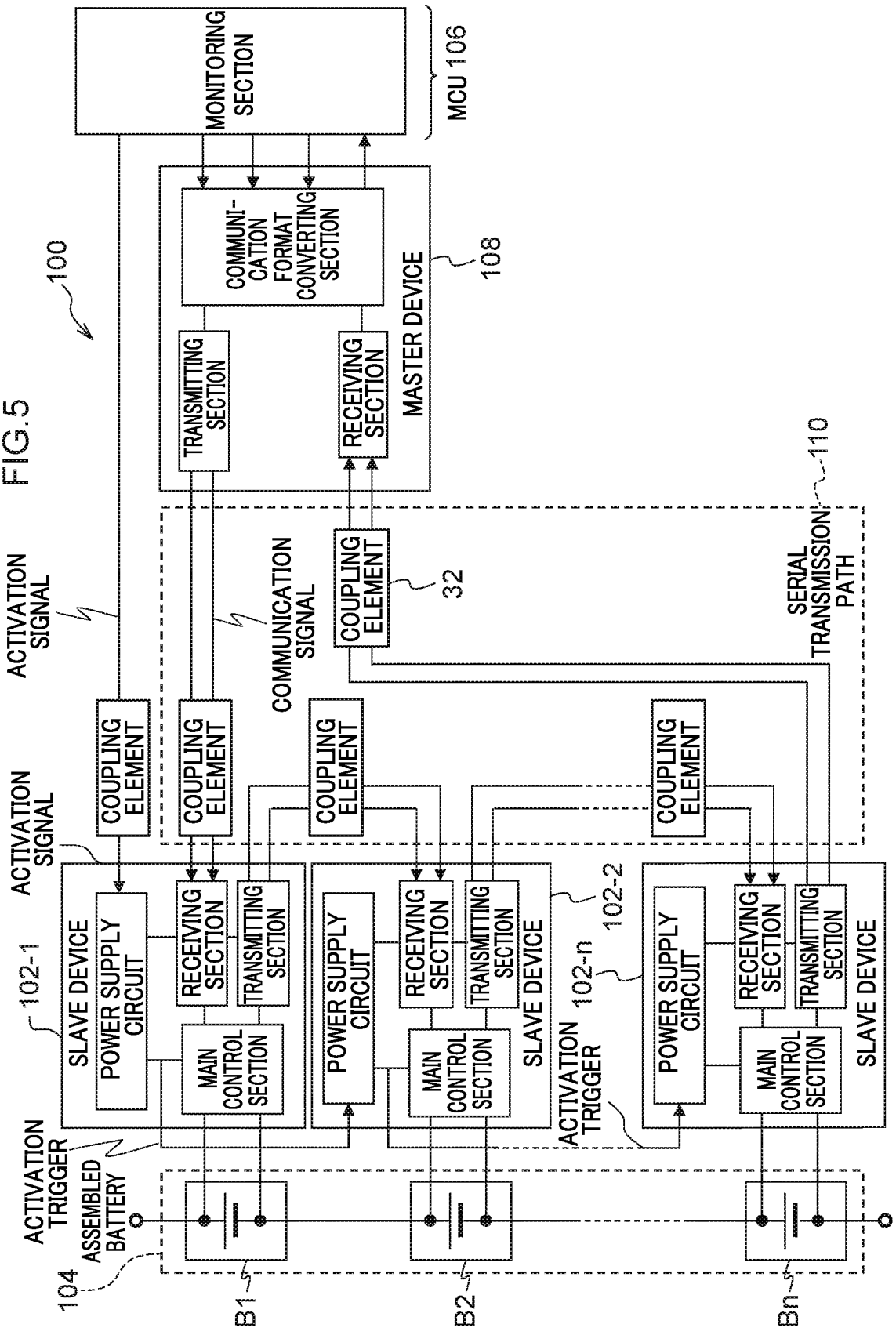
FIG. 5 is a block diagram showing a configuration of a battery monitoring system according to a comparative example.

Here, an activation method for a battery monitoring system 100 according to a comparative example will be described with reference made to FIG. 5. The battery monitoring system 100 includes slave devices 102-1, 102-2, . . . , 102-*n* (hereinafter, when described collectively these will be referred as 'slave devices 102), an assembled battery 104, a MCU 106, a master device 108, and a serial transmission path 110.

In the battery monitoring system 100, the elements indicated with the same name as in the battery monitoring system 1 shown in FIG. 1 has the same functions, a detailed description thereof is omitted. The point that differs between the battery monitoring system 100 and the battery monitoring system 1 is that, in the battery monitoring system 1, an activation trigger that is input to the power supply circuit 46 is generated based on an activation signal transmitted from the master device 16 to the activation receiving section 40. In contrast, in the battery monitoring system 100, an activation signal is transmitted from the monitoring section directly to the power supply circuit. In the battery monitoring system 100 as well, a looping communication path is configured by the slave devices 102 that are connected in a daisy-chain connection to the master device 108.

The activation method for the battery monitoring system 100 is as follows. Namely, an activation signal generated by the monitoring section of the MCU 106 is input to the most upstream slave device 102-1 (i.e., battery monitoring IC) via a coupling element. In the slave device 102-1, the activation signal becomes an activation trigger that causes the power supply circuit to be activated, so that power supply voltage for the receiving section and the transmitting section is generated. At the same time, as the power supply voltage generated by the power supply circuit is used by the transmitting section and the receiving section, the power supply voltage is also output to the exterior of the slave device 102-1 and is input to the slave device 102-2 at the next stage. The slave device 102-2 detects that the level of the voltage generated by the slave device 102-1 exceeds a particular threshold value, and activates its own power supply circuit. The operation described above is then executed in sequence right down to the slave device 102-*n*, so that all of the slave devices 102 connected to the daisy-chain are activated.

However, in the battery monitoring system 100, activation signals needed to be generated, transmitted and received on a separate path from the communication line that is used for communication from the monitoring section of the MCU 106 to the slave devices 102 (i.e., the battery monitoring IC). The battery monitoring system 1 according to the present exemplary embodiment is intended to solve the above.

Referring once again to FIG. 1, in order to conform with the activation method of the slave devices 20 (i.e., the battery monitoring system 1) of the present exemplary embodiment, in the battery monitoring system 1, the transmission path for the activation signals output from the monitoring section 22 is deleted and, instead, this activation signal is received by the activation receiving section 40 of the slave device 20.

The slave devices 20 according to the present exemplary embodiment will now be described in more detail with reference to FIG. 2. As is described above, the slave devices 20 according to the present exemplary disclosure are configured to include the activation receiving section 40, the receiving section 42, the transmitting section 44, the power supply circuit 46, and the main control section 48.

The power supply circuit 46 supplies power to each circuit within the slave devices 20. The main control section 48 receives the various types of control signal (i.e., the commands) transmitted from the monitoring section 22, and executes the necessary processing relating to that slave device 20.

The receiving section 42 is a communication interface that receives the various types of control signal transmitted from the monitoring section 22, and transmits them to the main control section 48. The transmitting section 44 is a communication interface that transmits to the monitoring section 22 information and the like relating to a battery cell B, such as the voltage and the like, collected by the main control section 48. Additionally, the transmitting section 44 also transmits control signals to the slave device 20 at the next stage in the daisy-chain to which the slave devices 20 are connected.

The activation receiving section 40 receives the activation signal sent from the monitoring section 22 that activates the slave devices 20 (i.e., the battery monitoring systems 1). In the present exemplary embodiment, the activation signals are sent from the monitoring section 22 towards the slave devices 20 along the same path as the path used to transmit the various types of control signal. Due thereto, the signal input to the receiving section 42 is split, and is also input to the activation receiving section 40. In this configuration, the signal sent from the monitoring section 22 is input to either the activation receiving section 40 or the receiving section 42 by a switch 50 (described below; see FIG. 3). The switch 50 corresponds to the 'switching section' according to the present disclosure.

As is shown in FIG. 2, the activation receiving section 40 that received the activation signal outputs an activation trigger to the power supply circuit 46. The power supply circuit 46 that receives the activation trigger starts itself up, and then supplies power to the remaining configuration within the slave device 20 including the main control section

48, the receiving section 42, and the transmitting section 44. Thereafter, the switch 50 switches to the receiving section 42 side, and the various types of control signal are input to the receiving section 42.

The configuration of the above-described receiving portion is the same in the downstream-side slave devices 20 as well. In other words, the transmitting section 44 of the upstream-side slave device 20 is configured to input signals into either the receiving section 42 or the activation receiving section 40 on the downstream side, so that the same type of operations as the above-described operations are executed at each consecutive stage in the downstream direction. As a result, activation signals are transmitted from an upstream-side slave device 20 towards a downstream-side slave device 20 via a path configured by connecting the transmitting sections 44 and receiving sections 42 in a daisy-chain connection.

Figure 3:
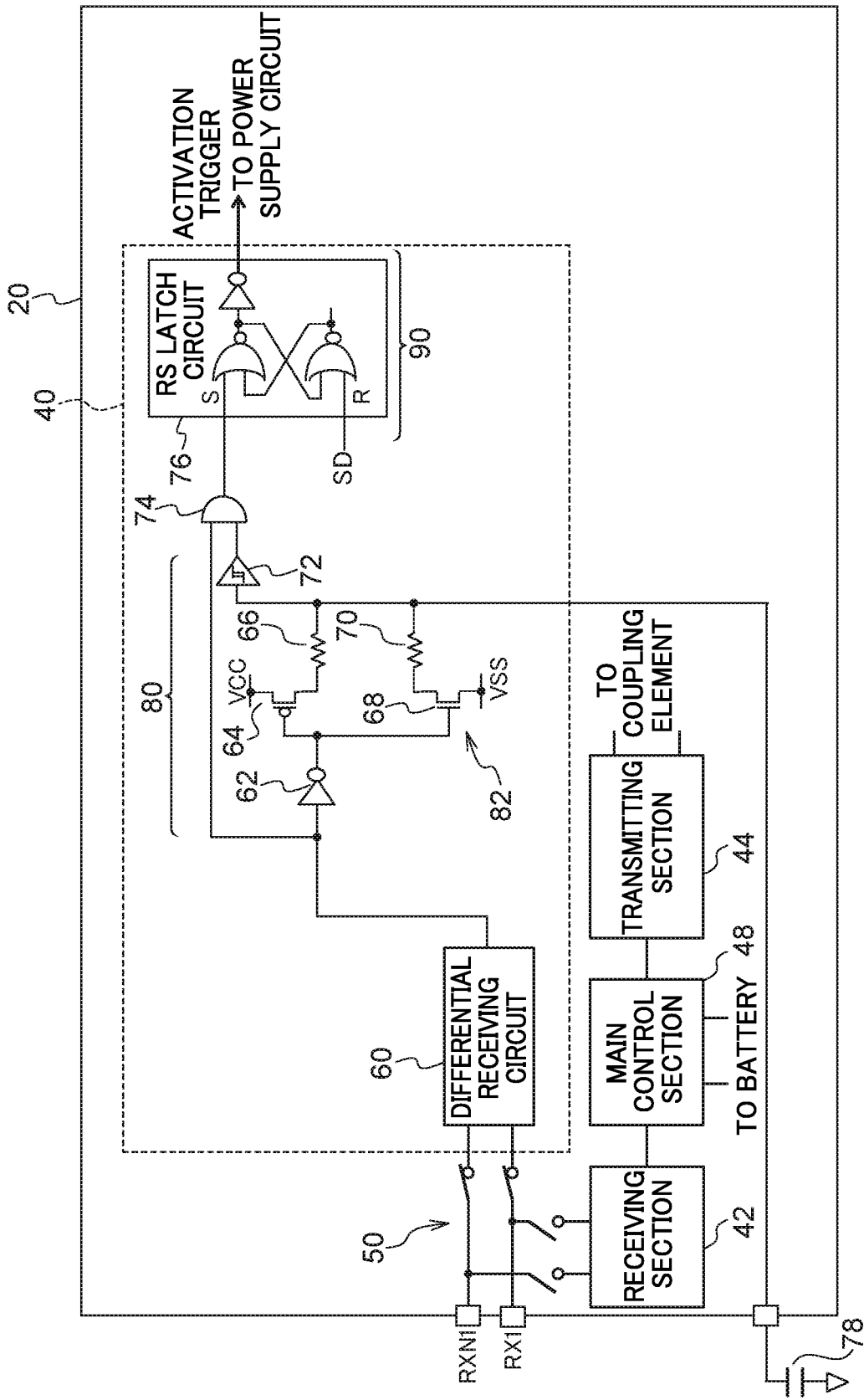
FIG. 3 is a circuit diagram showing a configuration of an activation receiving section according to an exemplary embodiment.

An activation operation of the above-described slave devices 20 will now be described in more detail with reference to FIG. 3. FIG. 3 shows an example of the configuration of a slave device 20 and, in particular, the configuration of an activation receiving section 40 is shown by a circuit diagram. The slave device 20 is provided with the switch 50, and various types of control signal (i.e., reception input signals) including activation signals that are input to RXN1 and RX1 which are reception input terminals, are switched between being sent to the activation receiving section 40 and being sent to the receiving section 42 by the switch 50. In other words, the switch 50 is a two-way switch having a switch provided on the activation receiving section 40 side, and a switch provided on the receiving section 42 side, and this two-way switch is switched exclusively.

As is shown in FIG. 3, the activation receiving section 40 includes a differential receiving circuit 60, noise filter section 80, an AND circuit 74, and a latch section 90.

The differential receiving circuit 60 receives reception input signals, which are differential signals, and converts to an output signal having an internal signal level capable of driving the next stage, and is configured, for example, by a differential amplifier.

The noise filter section 80 includes an inverter 62, an RC delay circuit 82, and a Schmitt trigger circuit 72. As is shown in FIG. 3, reception input signals inverted by the inverter 62 are input to the RC delay circuit 82. The RC delay circuit 82 is an RC filter configured by a P-type FET (Field Effect Transistor, hereinafter, referred to as a 'transistor') 64 whose source is connected to a VCC, a resistor 66 that is connected to a drain of the transistor 64, an N-type FET (hereinafter, referred to as a 'transistor') 68 whose drain is connected to a VSS, a resistor 70 that is connected to a source of the transistor 68, and a capacitor 78. The capacitor 78 forms an external attachment element of the slave device 20 in order to enable the time constant thereof to be adjusted. In the present exemplary embodiment, the resistor 66 is connected to the VDD side, and determines the rise time of the reception input signals. Furthermore, the resistor 70 is connected to the VSS side, and determines the fall time of the reception input signals. In the present exemplary embodiment, resistance values of the resistor 66 and 70 are selected such that the rise time becomes relatively faster and the fall time becomes relatively slower, in order to gradually increase the level of the signal that is used to generate an activation trigger.

An output from the RC delay circuit 82 is connected to the Schmitt trigger circuit 72. The Schmitt trigger circuit 72 is a circuit in which output state changes with hysteresis in response to changes in the input potential and, in the present exemplary embodiment, has the functions of a buffer, and preventing chattering caused by noise.

The And circuit 74 calculates a logical product of the output from the Schmitt trigger circuit 72 and the differential receiving circuit, determines the timing of the end of the signal input to the latch section 90 at the next stage, and also decides the signal width.

The latch section 90 includes an RS latch circuit 76, and generates an activation trigger used to activate the power supply circuit 46 by latching the signal from the AND circuit 74. A shutdown signal SD, input to a reset terminal (denoted by 'R' in FIG. 3) of the RS latch terminal 76, is a signal that causes the creation of activation triggers to be reset, in a case necessary, such as in the event of a power supply voltage fault or the like.

Overall operations of the battery monitoring system 1 will now be described in more detail while referring once again to FIG. 1. In the present exemplary embodiment, the monitoring section 22 of the MCU 14 is provided with, as an example, a four-line serial interface that operates in a four-line serial communication format. Further, the slave device 20 is provided with, as an example, a two-line differential interface that operates in a two-line differential communication format. The communication format converting section 24 of the master device 16 performs conversions from the four-line serial communication format to the two-line differential communication format, and also performs inverse conversions to these. However, it should be noted that these communication formats are merely being used as examples, and other communication formats may also be used. For example, it is also possible for communication between the monitoring section 22 and the slave device 20 to be performed directly using the two-line differential communication format.

Firstly, it will now be assumed that, in an initial state, all of the slave devices 20 are in a shutdown state. In the slave devices 20 of the present exemplary embodiment, in this shutdown state, a low-voltage power supply that is used by low breakdown voltage elements that form the circuits capable of performing high-speed operations (i.e., high-speed operating circuits, specifically, circuits of the receiving section 42, the main control section 48, and the transmitting section 44 and the like) is turned OFF. On the other hand, a power supply for low-speed circuits used by high breakdown voltage elements (i.e., low-speed operating circuits, specifically, circuits of the activation receiving section 40 and the like) is turned ON.

Firstly, the monitoring section 22 transmits an activation command (i.e., a write command) to the master device 16 using the four-line serial interface. In the communication format converting section 24 of the master device 16, communication format conversion processing to convert this activation command from a four-line serial communication format to a two-line differential communication format is executed. The activation command that has undergone format conversion processing in the communication format converting section 24 is then sent from the transmitting section 26 to the activation receiving section 40 of the slave device 20-1 via the coupling element 30-1.

At this time, as is described above, because the slave device 20-1 is in a shutdown state and the high-speed operating circuits thereof are not operating, the signal for activation that contains the above-described activation command is received by the low-speed operating circuits. Due thereto, instead of the signal for activation being a high-speed two-line differential signal that is used in normal communication, it is necessary to make the activation signal a signal having a lower frequency (i.e., having a long pulse width: a low-frequency signal). The communication format converting section 24 of the master device 16 converts a portion of the activation signal sent as a four-line serial signal into a signal for activation which is configured by this low-frequency signal. Hereinafter, a signal transmitted on a looping communication path in an activation-completed normal state is referred to as a 'control signal', while the above-described signal for activation is referred to as an 'activation pulse signal', and a (superimposed) signal in which the activation pulse signal has been added to the control signal is referred to as an 'activation signal'.

Figure 4:
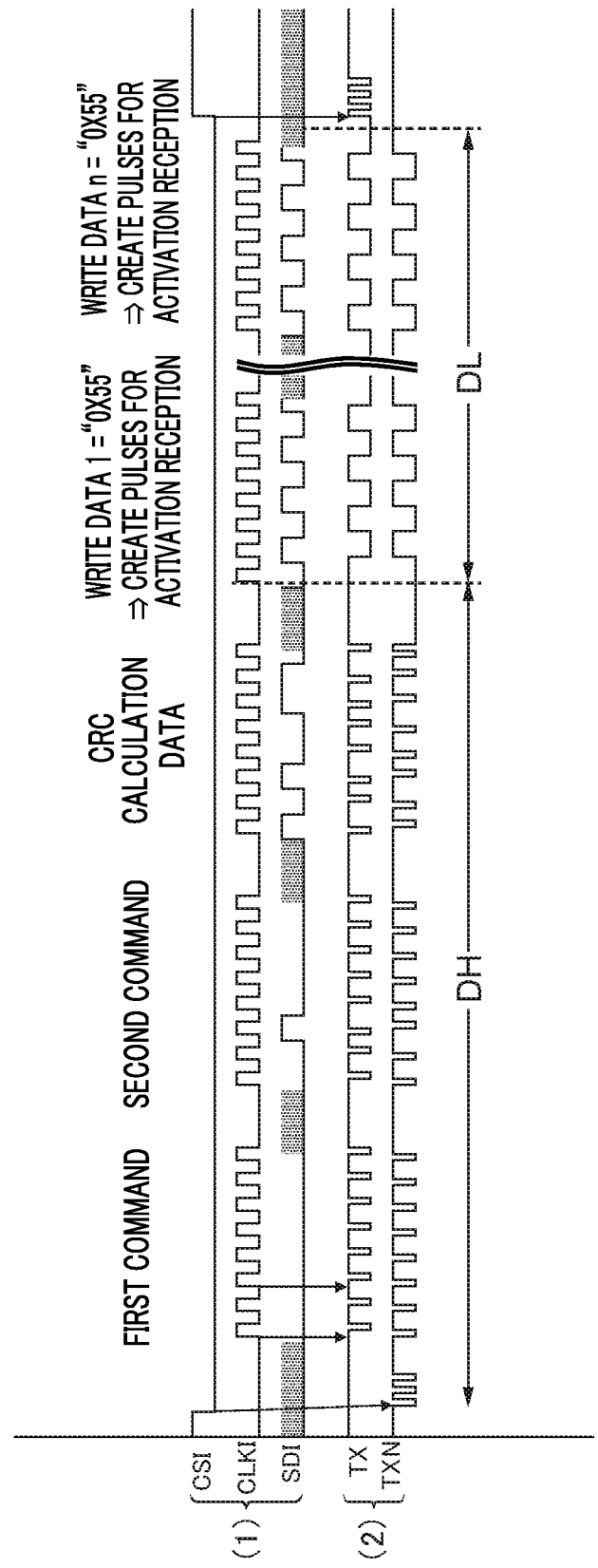
FIG. 4 is a timing chart showing a format of an activation signal according to an exemplary embodiment.

An example of the conversion of an activation signal from a four-line serial signal into a two-line differential signal will now be described while referring to FIG. 4. FIG. 4 is a timing chart showing an example of the format of an activation command, with (1) showing waveforms of CSI, CLKI, and SDI, which are four-line serial signals output from the monitoring section 22, and (2) showing waveforms of TX and TXN, which are two-line differential signals output from the transmitting section 26. As is shown in FIG. 4, an activation command according to the present exemplary embodiment is configured by plural command strings, namely, is defined as a first command, a second command, CRC calculation data, and repeated write data "0x55" (in FIG. 4, an example of this write data "0x55" being repeated n number of times is shown). However, 0x55 is 55 in a hexadecimal base, and if this is converted into binary, then it becomes an alternating pattern (i.e., a repetition) of 1, 0.

In FIG. 4, following predetermined conversion rules, the four-line serial signal shown in (1) is converted into the two-line differential signal shown in (2). Hereinafter, this conversion is referred to as a 'four-line/two-line conversion'. Since the conversion rules for a four-line/two-line conversion have no direct bearing on the present disclosure, a detailed description thereof is omitted. Hereinafter, the regions of the first command, second command, and CRC calculation data are referred to as a 'high-speed data signal DH', while the region of the write data 1 "0x55" to write data n "0x55" is referred to as a 'low-speed data signal DL'. This low-speed data signal DL is the above-described activation pulse signal.

As is shown in FIG. 4, although the signal speed is not changed by four-line/two-line conversion (in other words, normal four-line/two-line conversion does not take place) in the high-speed data signal DH, in the low-speed data signal DL, the signal speed is lowered by four-line/two-line conversion. In the present exemplary embodiment, the low-speed data signal DL generates a signal by latching the SDI terminal input using the CLKI terminal input, and then outputs this signal. As a result, the activation pulse signal becomes a signal having half the frequency of the CLKI signal. An activation signal containing this activation pulse signal is output from the transmitting section 26, and is transmitted to the activation receiving section 40 of the slave device 20-1 via the coupling element 30-1. Note that, in FIG. 4, an example is shown in which the communication speed of the low-speed data signal DL is dropped by half. However, this communication speed reduction ratio is not limited to one half, and may be appropriately set, for example, in accordance with the circuit speed of the activation receiving section 40. In the present exemplary embodiment, the alternating pattern of 1, 0 that forms this activation pulse signal (in other words, the low-speed data signal DL) is input to the activation receiving section 40 as a signal for activation.

Here, in a case in which the coupling elements 30 and 32 are configured by transistors as in the present exemplary embodiment, since an activation signal is transmitted via these transistors, in a case in which the frequency of the signal pulses forming this activation signal becomes lower, it becomes more difficult to transmit the activation signal if the inductance of the transistors is not increased. In other words, if pulses having a long cycle (i.e., write data 0xFF) are used as the activation signal, then transistors having an extremely large inductance are required. Due to the above, in the present exemplary embodiment, an activation signal configured by plural pulse strings having a comparatively short cycle is used.

After the activation signal has passed the coupling element 30-1, the activation signal is input to the slave device 20-1. At this time, because the slave device 20-1 is in a shutdown state, and the switch 50 is connected to the differential receiving circuit 60 side, the activation signal is input to the activation receiving section 40, and an activation trigger for the power supply circuit 46 is generated due to the above-described operation. In a case in which the activation trigger is input to the power supply circuit 46, the respective power sources within the slave device 20-1 (i.e., the battery monitoring IC) are turned ON, power is supplied to the main control section 48, and the slave device 20-1 is activated. Thereafter, the switch 50 shown in FIG. 3 is switched to the receiving section 42 side.

Next, as a part of the activation sequence, the main control section 48 generates (i.e., reproduces) the same pulse string as the activation signal that has been sent from the master device 16, and sends the pulse string to the transmitting section 44. The transmitting section 44 then transmits this activation signal without modifying to the activation receiving section 40 of the slave device 20-2 via the coupling element 30-2 located at the next stage. The power supply circuit 46 in the slave device 20-2 is then started up through the same procedure as the slave device 20-1 described above, and the activation signal is sent to the activation receiving section 40 of the slave device 20-3.

By continuously repeating the above operation so that the same operation is sequentially executed until the most downstream slave device 20-*n*, all of the slave devices 20 that are connected in the daisy-chain are in an activation state.

Next, an operation from when an activation signal is input to the activation receiving section 40 until the power supply circuit 46 is activated will be described in more detail while referring to FIG. 3.

As is described above, the switch 50 that switches exclusively between sending an activation signal to the activation receiving section 40 or to the receiving section 42 is provided on the reception input terminals RXN1 and RX1 of the slave device 20.

The activation signal, transmitted from the monitoring section 22 in a case in which the slave device 20 is in a shutdown state, is input to the activation receiving section 40 side, namely, into the differential receiving circuit 60. After the power supply circuit 46 has been activated, the main control section 48 controls the switch 50 such that the connection with the reception input terminals RXN1 and RX1 is switched from the activation reception section 40 to the reception section 42. Namely, in a case in which the connection remains to the activation receiving section 40, the input impedance of the activation receiving section 40 generates an excessive load, and this impedes high-speed communication on the receiving section 42 side. However, the present disclosure is not limited to the above. In a case in which there are no effect in the communication on both the activation receiving section 40 side and the receiving section 42 side, it is not necessary for the switch 50 to switch exclusively.

The differential receiving circuit 60 considers that a valid input has been made when the differential amplitude between the reception input terminals RXN1 and RX1 exceeds a predetermined regulated amplitude, and outputs a high level (hereinafter, referred to as 'H'). In all other states, a low level (hereinafter, referred to as 'L') is output. As is shown in FIG. 4 (1), since the activation signals that are actually input includes H (corresponding to a valid input) and L (corresponding to an invalid input) in a duty ratio of 50%, the output from the differential receiving circuit 60 becomes a pulse output having repeatedly alternating H and L. Here, there may be cases in which the output from the differential receiving circuit 60 do not become a pulse due to the effects of delay in the internal elements, however, in such cases, the constant of the elements in the differential receiving circuit 60 is adjusted such that the output is fixed as H (i.e., as a valid input).

Thereafter, the pulses having a duality ratio of 50% output from the differential receiving circuit 60 are input to the noise filter section 80. The capacitor 78 of the noise filter section 80 is charged when the input to the capacitor 78 is H, and is discharged when the input is L. The resistance value in the charging direction (namely, the resistance value of the resistor 66 at the VCC side) is approximately $\frac{1}{3}$ to $\frac{1}{2}$ smaller than the resistance value in the discharging direction (namely, the resistance value of the resistor 70 at the VSS side). Due thereto, in a case in which pulses having a duality ratio of 50% are continuously input, due to the time constant difference between charging and discharging, overall, the capacitor 78 advances in the charging direction.

At a timing when the charging has advanced and has exceeded an H threshold value of the Schmitt trigger circuit 72, H is output from the AND circuit 74 and is input to the latch section 90. In contrast, in a case in which the input to the capacitor 78 is stopped before exceeding the H threshold value and is fixed as L, the discharging from the capacitor 78 proceeds and the output from the AND circuit 74 remains as an L output. By performing the above operation, the noise filter section 80 functions as a noise filter that invalids short-period activation pulses.

In a case in which the output from the AND circuit 74 is H, H is input to a set terminal (denoted as 'S' in FIG. 3) of the RS latch circuit 76 of the latch section 90, and the output from the latch section 90, namely, the activation trigger for the power supply circuit 46 is set to H. Accordingly, an activation trigger for the power supply circuit 46 is generated.

Next, an operation performed in a case in which one particular slave device 20 other than the slave device 20-1, among the plural slave devices 20 that are connected in a daisy-chain connection, is activated from the shutdown state will be described. A case in which a particular slave device 20 is shut down, may occur when some kind of abnormality is suddenly occurred, such as, for example, a short circuit in the output from a power supply regulator included in this particular slave device 20 or the like. As a result of this, abnormality, in which only one particular slave device 20 is in a shutdown state.

In a case as described above, an activation signal is input to the slave device 20-1 which has already been activated. In a case in which the slave device 20-1 has already been activated, then, as is described above, the switch 50 provided in the reception input terminals RXN1 and RX1 is switched to the receiving section 42 side, and an activation signal is input to the receiving section 42.

Since the receiving section 42 is used for receiving a high-speed differential signal, conversely from the activation receiving section 40, it is possible for a portion of the high-speed data signal DH of the activation command string shown in FIG. 4, namely, as far as the first command, the second command, and the CRC calculation data to be received. However, the low-speed data signal DL that continues on from there, namely, the activation pulse signal for the power supply circuit 46 cannot be received.

Due to the above, the slave device 20-1 receiving the activation signal converts only the portion of the high-speed data signal DH capable of being received by the receiving section 42 into a serial logic signal, and delivers it to the main control section 48. In the main control section 48, the command string of this high-speed data signal DH is analyzed, and the fact that it is an activation command is recognized. The main control section 48 that has recognized the activation command generates (i.e., reproduces) an activation signal, and sends it to the activation receiving section 40 and the receiving section 42 of the slave device 20 at the next stage in the daisy-chain sequence via the transmitting section 44.

Once the slave device 20 at this next stage has completed activation, an activation signal is transmitted to the slave device 20 at the next stage in the sequence by performing the same operation as that performed by the above-described slave device 20-1. On the other hand, if the slave device 20 at the next stage in the sequence is in a shutdown state, then because the switch 50 is connected to the activation receiving section 40 side, this slave device 20 performs the same operation as that performed by the slave device 20-1 at the initial stage in the above-described activation procedure for a normal slave device 20, and the activation receiving section 40 receives an activation signal. The slave device 20 that has received the activation signal and is in a shutdown state starts up its own power supply circuit 46 in accordance with the above-described activation procedure for a normal slave device 20, and generates (i.e., reproduces) an activation signal which it then sends to the slave device 20 at the next stage.

Note that, in the above-described exemplary embodiment, a case in which the most upstream slave device 20-1 is in an activation state, and, among the other slave devices 20, some are in a halted state, has been described. However, if the slave device 20-1 is in a halted state, then in accordance with the aforementioned normal activation procedure, the slave device 20-1 reproduces an activation signal, and the slave devices 20 that are already activated reproduce an activation signal by performing the above-described procedure, and, thereafter, activation signals are sequentially transmitted so that all of the slave devices 20 are activated.

As described above, in the semiconductor device, battery monitoring system, and semiconductor device activation method according to the present exemplary embodiment, activation signals that activate battery monitoring IC are transmitted using communication lines over which commands and the like between a monitoring section and the battery monitoring IC (i.e., the slave devices 20) are transmitted and received. Due to the above, the present exemplary embodiment may omit any dedicated activation signal transmitting device that needs to be provided separately from these conventional communication lines, and any activation signal generating circuit, signal line for transmissions, terminals, external attachment circuits and the like are all rendered unnecessary. Accordingly, in the present exemplary embodiment, configuration of the battery monitoring system may be made even simpler, and even more low-cost.

Moreover, the activation signals are generated by combining both high-speed activation commands (i.e., the high-speed data signals DH) that can be received by the receiving section 42, which is a high-speed operating circuit, and low-speed (i.e., having a wide pulse width) activation pulse signals (i.e., the low-speed data signals DL) that can be received by the activation receiving section 40, which is a low-speed operating circuit. Due to the above, irrespective to whether each battery monitoring IC in the daisy-chain is in an activation state or is in a shutdown state, an activation signal can be circulated in a loop from the most upstream battery monitoring IC to the most downstream battery monitoring IC.

Note that, in the above exemplary embodiment, a case in which an activation trigger is generated in the activation receiving section 40, the duality of the activation pulse signals is set to 50%, and the activation pulse signals passes through the RC delay circuit 82 having a mutually different rise time constant and fall time constant, has been described as an example. However, the present disclosure is not limited to this. For example, the duality of the activation pulse signals may be greater than 50%, and the activation pulse signals may pass through an RC delay circuit having a the same rise time constant and fall time constant. Further, in the above exemplary embodiment, a case in which, when an activation trigger is generated in the activation receiving section 40, the activation trigger is generated by making the capacitor 78 charge or discharge, has been described as an example. However, the present disclosure is not limited to this. For example, the activation trigger may be generated by counting the number of activation signal pulses.

What is claimed is:

1. A semiconductor device comprising:
    a first receiving section and a second receiving section that receive control signals from outside of the semiconductor device;
    a control section that controls monitoring of an object based on the control signals;
    a power supply section that supplies power to internal circuits of the semiconductor device,
    wherein, in a case in which the power supply section is in a halted state, and in a case in which the first receiving section receives an activation signal in which an activation pulse signal is superimposed on the control signals, the first receiving section generates an activation trigger that activates the power supply section based on the activation pulse signal extracted from the activation signal, and
    wherein the second receiving section receives a supply of power from the power supply section after the power supply section has been activated by the activation trigger, and receives the control signals that follows the activation signal, and sends the control signals to the control section; and
    a switching section that switches an input destination of the control signals between the first receiving section and the second receiving section,
    wherein the control section switches the switching section to switch from a state in which the control signals are input to the first receiving section while the power supply section is in the halted state, to a state in which the control signals are input to the second receiving section, after the power supply section has been activated.

2. The semiconductor device according to claim 1, wherein:
    the control section and the second receiving section operate at or below a predetermined first upper speed limit; and
    the first receiving section operates at or below a second upper speed limit that is lower than the first upper speed limit.

3. The semiconductor device according to claim 2, wherein:
    the control signals are pulse signals having a frequency that operates at or below at least the first upper speed limit but does not operate at or below the second upper speed limit, and
    the activation pulse signal is a pulse signal having a frequency that operates at or below the second upper speed limit.

4. The semiconductor device according to claim 1, wherein:
    the first receiving section includes a delay circuit configured by resistors and capacitors, and
    the activation pulse signal is a signal including an alternating pattern of logical values 1 and 0, and
    the delay circuit generates a signal for generating the activation trigger by repeatedly charging and discharging the capacitors via the resistors in accordance with the activation pulse signal.

5. The semiconductor device according to claim 4, wherein:
    a duality of the activation pulse signal is 50%; and
    the delay circuit is configured such that a time constant differs between a rise and a fall of the activation pulse signal.

6. A battery monitoring system comprising:
    a battery;
    the semiconductor device according to claim 1 in which the battery is the object that is monitored;
    a monitoring device that transmits the control signals; and
    a converting device that converts the control signals to provide the activation signal.

7. The battery monitoring system according to claim 6, wherein:
    the battery monitoring system includes a plurality of semiconductor devices and a plurality of batteries;
    each semiconductor device monitors a corresponding one of the plurality of batteries, and is connected in series to the other semiconductor devices so as to form a semiconductor device group;
    each semiconductor device includes a transmitting section that transmits the control signals, and
    a communication path loop is configured by connecting the transmitting section of each semiconductor device to the first receiving section and the second receiving section of the semiconductor device at a next stage, connecting the first receiving section and the second receiving section of the semiconductor device at a most upstream one of the semiconductor device group to the converting device and receiving the control signal, and connecting the transmitting section of a most downstream one of the semiconductor device group to the converting device and transmitting a response signal that corresponds to the control signal.

8. The battery monitoring system according to claim 7, wherein, in a case in which each one of the plurality of semiconductor devices is in the halted state, the power supply sections in each of the semiconductor devices are respectively activated by:

executing a reproduction operation including
  receiving, via the first receiving section, an activation signal sent from an upstream side and activating the power supply section, and
  reproducing, by the control section, the received activation signal and transmitting the reproduced activation signal to a downstream side via the transmitting section; and
performing the reproduction operation in sequence from a most upstream semiconductor device down to a most downstream semiconductor device.

9. The battery monitoring system according to claim 7, wherein, in a case in which some of the semiconductor devices are in the halted state and some of the semiconductor devices are in an activated state in the semiconductor device group, the power supply sections in each of the semiconductor devices are activated by:
  in the semiconductor devices in the halted state, executing a first reproduction operation including
    receiving, via the first receiving section, an activation signal sent from the upstream side and activating the power supply section, and
    reproducing, by the control section, the activation signal and transmitting the reproduced activation signal to the downstream side via the transmitting section, and
  in the semiconductor devices in the activated state, executing a second reproduction operation including
    receiving, via the second receiving section, an activation signal sent from the upstream side and activating the power supply section, and
    reproducing, by the control section, the activation signal and transmitting the reproduced activation signal to the downstream side via the transmitting section thereof, and
  performing the first reproduction operation or the second reproduction operation in sequence from the most upstream semiconductor device down to the most downstream semiconductor device.

10. The battery monitoring system according to claim 7, further comprising a DC cut-out element, provided at the communication path loop, that cuts out at least one direct current.

11. A semiconductor device activation method for a semiconductor device including a first receiving section and a second receiving section that receive control signals from outside of the semiconductor device, a control section that controls monitoring of an object based on the control signals, a power supply section that supplies power to internal circuits, and a switching section that switches an input destination of the control signals between the first receiving section and the second receiving section, the method comprising:
  generating, by the first receiving section, in a case in which the power supply section is in a halted state, and in a case in which the first receiving section receives an activation signal in which an activation pulse signal is superimposed on a control signal, an activation trigger that activates the power supply section based on the activation pulse signal extracted from the activation signal;
  receiving, by the second receiving section, a supply of power from the power supply section after the power supply section has been activated by the activation trigger, and receiving the control signals that follows the activation signal, and sending the control signals to the control section; and
  switching, by the control section, the switching section to switch from a state in which the control signals are input to the first receiving section while the power supply section is in the halted state, to a state in which the control signals are input to the second receiving section, after the power supply section has been activated.

* * * * *